United States Patent
Lai et al.

(10) Patent No.: US 8,153,471 B2
(45) Date of Patent: Apr. 10, 2012

(54) METHOD FOR FORMING A REDUCED ACTIVE AREA IN A PHASE CHANGE MEMORY STRUCTURE

(75) Inventors: Li-Shyue Lai, Jube (TW); Chao-Hsiung Wang, Hsinchu (TW); Denny Tang, Saratoga, CA (US); Wen-Chin Lin, Hsin-chu (TW)

(73) Assignee: Taiwan Semiconductor Manufacturing Co., Ltd, Hsin-Chu (TW)

( * ) Notice: Subject to any disclaimer, the term of this patent is extended or adjusted under 35 U.S.C. 154(b) by 0 days.

(21) Appl. No.: 12/945,860

(22) Filed: Nov. 14, 2010

(65) Prior Publication Data

US 2011/0059590 A1    Mar. 10, 2011

Related U.S. Application Data

(62) Division of application No. 10/791,607, filed on Mar. 1, 2004, now Pat. No. 7,858,980.

(51) Int. Cl.
*H01L 21/06* (2006.01)

(52) U.S. Cl. ....... 438/102; 257/2; 257/42; 257/E27.002; 257/E27.004; 257/E45.002; 257/E47.001

(58) Field of Classification Search .................. 438/102; 257/2, 42, E47.001, E27.002, E45.002, 27.004
See application file for complete search history.

(56) References Cited

U.S. PATENT DOCUMENTS

| 6,013,547 | A  |   | 1/2000  | Liaw |
| 6,967,865 | B2 |   | 11/2005 | Lee |
| 6,969,866 | B1 | * | 11/2005 | Lowrey et al. ........ 257/E45.002 |
| 7,038,230 | B2 | * | 5/2006  | Chen et al. ........................ 257/2 |
| 2003/0038301 | A1 |   | 2/2003 | Moore |
| 2004/0026686 | A1 |   | 2/2004 | Lung |
| 2004/0157416 | A1 |   | 8/2004 | Moore et al. |
| 2005/0145984 | A1 |   | 7/2005 | Chen et al. |
| 2006/0017076 | A1 |   | 1/2006 | Lankhorst et al. |

* cited by examiner

*Primary Examiner* — Mary Wilczewski
*Assistant Examiner* — Toniae Thomas
(74) *Attorney, Agent, or Firm* — Tung & Associates

(57) ABSTRACT

A phase change memory structure and method for forming the same, the method including providing a substrate comprising a conductive area; forming a spacer having a partially exposed sidewall region at an upper portion of the spacer defining a phase change memory element contact area; and, wherein the spacer bottom portion partially overlaps the conductive area. Both these two methods can reduce active area of a phase change memory element, therefore, reducing a required phase changing electrical current.

20 Claims, 2 Drawing Sheets

METHOD FOR FORMING A REDUCED ACTIVE AREA IN A PHASE CHANGE MEMORY STRUCTURE

This is a Divisional of a application Ser. No. 10/791,607, filed on Mar. 1, 2004 now U.S. Pat. No. 7,858,980.

FIELD OF THE INVENTION

This invention generally relates to microelectronic integrated circuit (IC) semiconductor device fabrication and more particularly to a method for forming a reduced active area of a phase change memory element to reduce a required phase changing electrical current.

BACKGROUND OF THE INVENTION

Phase change memory devices use phase changing materials, for example, materials where a phase change can be induced by an electrical energy, where a sufficient thermal heat induced by this electrical energy will result in a temperature change in the phase change materials, for example a current or voltage applied to the material to induce heating in the phase changing material. For example, the phase changing material may change between amorphous and crystalline including partially amorphous and partially crystalline, the nature of the phased state being detectable, for example by a number of order in resistance change, typically is larger than one order, and thereby forming stored information. Typical phase changing materials suitable for memory elements include those utilizing various chalcogenide elements, for example one or more elements from Column VI of the periodic table. One particularly suitable group of alloys is the GeSbTe alloys system.

Phase changing memory elements have several advantages over other types of memory including DRAM, SRAM, and Flash memory. For example, they are non-volatile and may be written to with high speed, e.g., less than about 50 nanoseconds. Since transistors are not necessary to accomplish the read and write operations, the memory cells may be formed at high density. In addition, such memory cells are compatible with CMOS logic and are low power and low cost.

One goal for producing phase changing memory cells is to reduce the power consumption by reducing the amount of drive current required to effect a phase change in the phase changing memory element. The required drive current is dictated by the resistance of the phase changing material as well as the active area of the phase changing material, which is dictated by the area to which electric contact is made to the phase changing material (phase change memory element) to deliver a phase changing current. In general, assuming a given resistance of the phase changing material, a smaller contact area produces a higher resistance and therefore a higher level of resistive heating (temperature) for a given applied writing (drive) current. Therefore a smaller electrode contact area to the phase changing material memory element will correspondingly and desirably reduce drive current and thereby power consumption.

There have been various approaches in the prior art to reduce the phase change memory cell electrode contact area (active area). In general, prior art approaches have relied on photolithographic and etching techniques to pattern and form as small a contact area as possible. These approaches are difficult to scale down in size due the limited processing windows in lithographic and etching processes at the desired sizes. Other approaches have relied on forming complicated memory cell structures that rely on complicated and therefore costly processing steps to produce various memory elements and electrode shapes.

Thus, there is a need in the semiconductor manufacturing art for an improved phase change memory element and method for forming the same to reduce an electrical contact area to the memory element thereby reducing power consumption.

It is therefore an object of the invention to provide an improved phase change memory element and method for forming the same to reduce an electrical contact area to the memory element thereby reducing power consumption, while overcoming other shortcomings and deficiencies of the prior art.

SUMMARY OF THE INVENTION

To achieve the foregoing and other objects, and in accordance with the purposes of the present invention, as embodied and broadly described herein, the present invention provides a phase change memory structure and method for forming the same.

In a first embodiment, the method includes a phase change memory structure and method for forming the same, the method including providing a substrate comprising a conductive area; forming a spacer having a partially exposed sidewall electrode at an upper portion of the spacer defining a phase change memory element contact area; and, wherein the spacer bottom portion partially overlaps the conductive area.

These and other embodiments, aspects and features of the invention will be better understood from a detailed description of the preferred embodiments of the invention, which are further described below in conjunction with the accompanying Figures.

DETAILED DESCRIPTION OF THE PREFERRED EMBODIMENTS

Although the phase change memory structure and method of forming the same is explained with reference to an exemplary memory cell, it will be appreciated that the spacer electrode and spacer memory elements formed according to embodiments of the invention may be used in the formation of other memory cell structures where a spacer is formed with exposed sidewall electrode at an upper portion to form a contact area of phase change memory element.

Figure 1A:
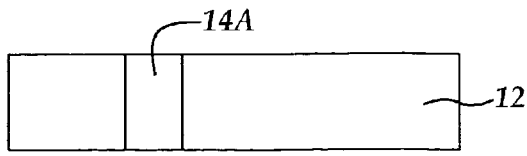
FIGS. 1A-1F are cross sectional view of a portion of a phase change memory cell at manufacturing stages according to an embodiment of the present invention.

Referring to FIG. 1A, in one embodiment of the present invention a first inter-layer dielectric (ILD) 12 formed of a conventional silicon oxide dielectric such as PECVD silicon oxide is formed over a substrate (not shown) where the ILD layer includes a conductive area, for example a plug 14A formed by conventional damascene methods. The conductive plug may be formed of conductive materials such as W, TiN, TiW, TiAl, or TiAlN, or combinations thereof. It will be appreciated that the first ILD layer 12 may be formed of a variety of dielectric insulating materials including PECVD oxide, PETEOS, BPTEOS, BTEOS, PTEOS, TEOS, PEOX, low-K (K<2.9) dielectrics, and fluorine doped silicate glass (e.g., FSG). The conductive plug e.g., 14A provides electrical connection to a current driving circuit (not shown), for example including CMOS devices.

Figure 1B:
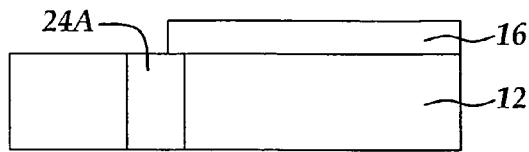

Referring to FIG. 1B, a dielectric layer portion 16 (mesa dielectric) formed of a dielectric insulating material such as silicon oxide, preferably PECVD oxide, deposited over the ILD layer 12 and lithographically patterned and etched to form the dielectric portion 16. It will be appreciated that the dielectric layer portion 16 may be formed of one or more of the same preferred insulating dielectrics as outlined for the first ILD layer. The dielectric portion 16 need not be, but in the present embodiment is shown formed overlapping a portion of the conductive plug 14A.

Figure 1C:
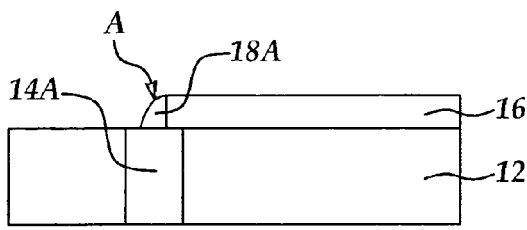

Referring to FIG. 1C, a conductive layer is first blanket deposited by conventional CVD or PVD methods over the process surface followed by etching back the conductive layer by a conventional dry and/or wet etching process to form conductive spacer 18A adjacent the dielectric portion 16 (sidewall) and partially overlapping the conductive plug 14A. Preferably the conductive spacer 18A is formed of a highly conductive material readily etchable such as W, TiN, TiW, TiAl, or TiAlN, or combination thereof. It will be appreciated that the maximum width of the spacer 18A may be formed with a variable maximum width dimension including adjusting the amount by which the spacer partially overlaps the conductive plug 14A, thus adjusting a resistance of the spacer (e.g., electrode).

Figure 1D:
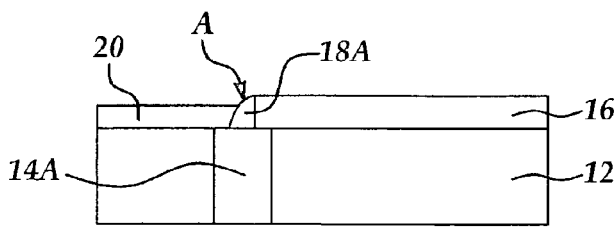

Referring to FIG. 1D, in an important aspect of the invention, a conventional spin-on-layer (SOL) 20, formed of organic or inorganic material such a spin-on-glass, spin-on dielectric (SOD), benzocyclobutene, or polymides (polyimides), is blanket deposited to cover the spacer 18A, followed by a wet and/or dry etchback process carried out for a predetermined period of time to uncover (expose) a predetermined portion of the top portion of spacer 18A, e.g., A, the exposed portion forming an electrode contact area (phase changing memory element electrode contact area) to a subsequently formed overlying upper electrode. For example, since the outer portion spacer is 18A is formed with an exposed sidewall electrode, etchback of the SOL may be carried for a predetermined time period to uncover a selected amount of the spacer 18A top portion, e.g., A, thus forming an adjustable electrode contact area. Thus, the phase changing memory element electrode contact area (electrode contact area) e.g., A, may be determined by the etching back process, for example an etching back time period. The electrode contacting area to the phase changing memory element is preferably as small as possible, typically is less than about 10000 $nm^2$, more preferably less than about 1000 $nm^2$, even more preferably less than about 100 $nm^2$.

Figure 1E:
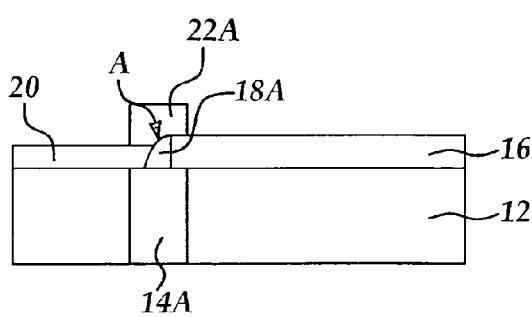

Referring to FIG. 1E, a temperature sensitive (phase change triggering) phase changing (structure changing) material layer, for example a chalcogenide including Ge, Te, and Sb, is blanket deposited by a conventional deposition process followed by a photolithographic patterning of the phase changing layer and a wet and/or dry etching process to form a phase change memory element portion 22A in contact with the exposed upper portion (electrode contact area), e.g., A of the conductive spacer 18A bottom electrode. It will be appreciated that the dimensions of the memory element portion 22A may be varied, for example shown to be about the same width as the bottom electrode (conductive plug 14A) but may be formed having larger or smaller dimensions. Preferably, however, the memory element portion is formed at least large enough to cover the exposed portion of the bottom electrode, e.g., A which is determined by the etchback time to uncover a predetermined portion of the upper portion of the spacer 18A.

Figure 1F:
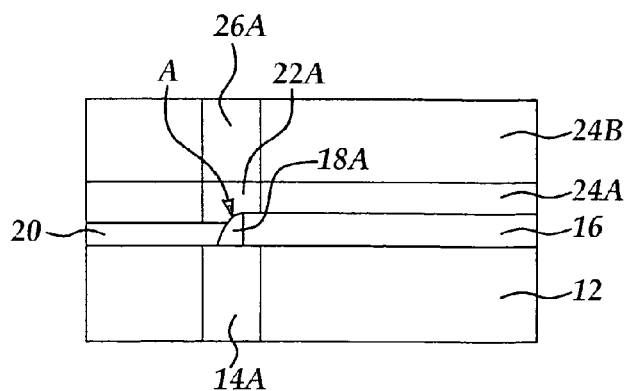

Referring to FIG. 1F, a second ILD layer 24A formed of the same preferred materials as the first ILD layer 12 is deposited and planarized, to electrically isolate the memory element portion 22A, followed by formation of a third planar ILD layer 24B over the second ILD layer followed by formation of a conductive plug e.g., 26A to form an upper electrode according to similar processes and preferred materials outlined for forming the first ILD layer 12 and conductive plug 14A.

Figure 2A:
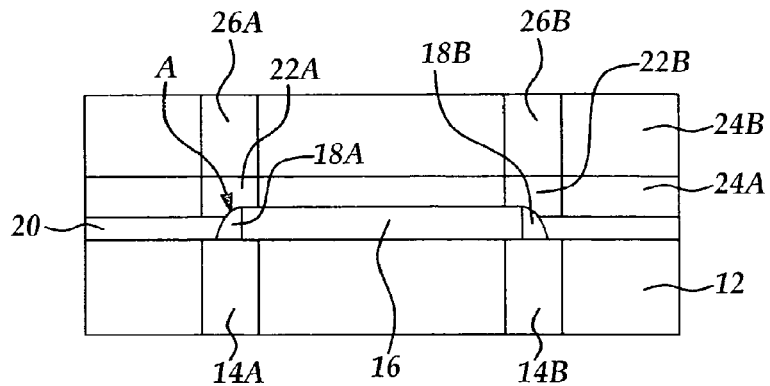
FIGS. 2A and 2B are cross sectional views of a portion of a phase change memory cell according to embodiments of the present invention.

Referring to FIG. 2A is shown an exemplary memory cell formed by the previously outline steps. For example conductive plugs 14A and 14B are formed in ILD layer 12, spacers 18A and 18B forming bottom electrodes, and an exposed bottom electrode contact area e.g., A, exposed for contacting a phase change memory elements e.g., 22A and 22B determined by etchback of SOL layer 20. Dielectric portion 16 is shown formed overlapping a portion of conductive plugs 14A and 14B allowing formation of thinner spacer bottom electrodes 18A and 18B. Phase change memory elements 22A and 22B are formed to encompass the electrode contact areas e.g., A to form a memory element contact areas over respective spacer bottom electrodes 18A and 18B. Second and third ILD layers 24A and 24B including conductive upper electrode portions 26A and 26B are then formed as previously outlined.

Figure 2B:
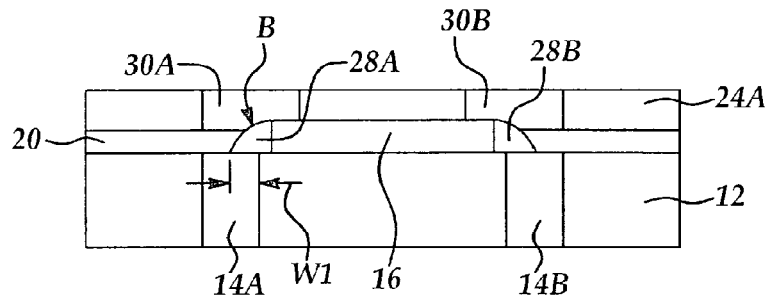

Referring to FIG. 2B, in another embodiment a similar series of process steps as outlined for FIGS. 1A through 1F are carried out to form a memory cell except that spacers 28A and 28B now form the phase changing material memory elements where an etchback process of SOL layer 20 exposes a portion e.g., B of the upper portion of the spacers to form a memory element electrode contact area with the top electrode. In this embodiment, the dielectric portion 16 is not formed to partially overlap the conductive plugs 14A and 142B, which now form the bottom electrodes. In this embodiment the bottom electrode contact area may be adjusted by determining the overlap width, W1, the spacers 28A and 28B overlap the conductive plugs 14A and 14B.

Still referring to FIG. 2B, upper electrode portions 30A and 30B are preferably formed of the same preferred conductive materials as the conductive plugs 14A and 14B, and may be formed of the same or different preferred materials. For example, a deposition, lithographic and wet or dry etchback process is carried out to form the upper electrodes 30A and 30B. In this embodiment, only a second ILD layer 24A is required to electrically isolate the upper electrodes 30A and 30B. Similar to the first embodiment the memory element electrode contact area (active area) is formed having an area less than about 10000 $nm^2$, more preferably less than about 1000 $nm^2$, even more preferably less than about 100 $nm^2$.

Thus, a phase change memory structure and method for forming the same to selectively form an active area to reduce a required drive current has been presented. Advantageously, spacer elements having an exposed sidewall in an upper portion may be formed and an etchback process may be carried out to uncover a selected portion of the upper portion of the spacer element to form a memory element electrode contact area (active area). In one embodiment the spacer elements 28A and 28B are formed of a phase change material overlapping on the bottom electrode 14A and 14B. In another embodiment, the spacer elements are formed of a phase changing material where the uncovered upper portion forms an upper electrode contact area. Advantageously, the process steps may be carried out easily and cost effectively, being compatible with existing CMOS formation processes. Advantageously, the memory element electrode contact area (active area), producing a programmable memory volume of the phase change memory element, may be adjustably formed, for example, reduced to decrease a programmable drive current thereby lowering power consumption.

Figure 3:
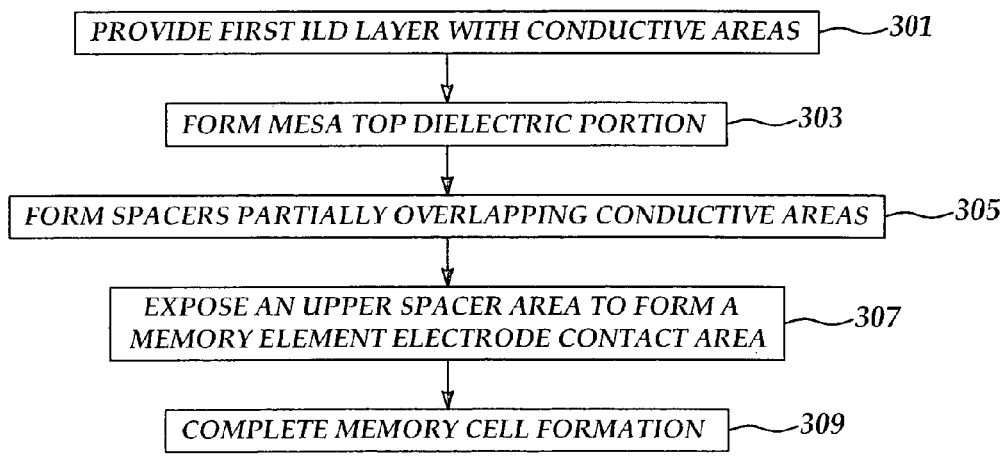
FIG. 3 is a process flow diagram including several embodiments of the present invention.

Referring to FIG. 3 is a process flow diagram including several embodiments of the present invention. In process 301, an ILD layer including a conductive plug is provided. In process 303, a mesa top dielectric portion is formed over the ILD layer. In process 305, spacer elements forming one of a memory element and memory electrode are formed adjacent the mesa top dielectric portion to overlap a portion of the conductive plug. In process 307, the spacer are covered by an SOL layer an upper portion uncovered to form a phase change memory element contact area. In process 309, the memory cell is completed including forming either a memory element over a respective bottom electrode spacer or an upper electrode over a respective spacer memory element.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A method for forming a phase change memory structure comprising: providing a substrate comprising a conductive area; forming a spacer having a partially exposed sidewall region at an upper portion of the spacer defining a phase change memory element contact area; said spacer forming step further comprises forming a spin-on-layer (SOL) over the spacer; and, removing a portion of the SOL to uncover an upper portion of the spacer to define an electrode contact area for a phase changing memory element; and wherein the spacer bottom portion partially, overlaps the conductive area.

2. The method of claim 1, wherein the spacer comprises a phase changing material sensitive to temperature.

3. The method of claim 2, wherein the phase changing material comprises a chalcogenide.

4. The method of claim 3, wherein the chalcogenide comprises a material selected from the group consisting of Ge, Te, and Sb and their alloy system.

5. The method of claim 2, further comprising the step of forming an upper conductive electrode on the electrode contact area.

6. The method of claim 5, wherein the upper conductive electrode comprises a material selected from the group consisting of W, TiN, TiW, TiAl, TiAlN, and combinations thereof.

7. The method of claim 1, wherein the spacer comprises a conductive material.

8. The method of claim 7, wherein the conductive material comprises a material selected from the group consisting of W, TiN, TiW, TiAl, TiAlN, and combinations thereof.

9. The method of claim 7, further comprising the steps of:
forming a phase changing memory element on the electrode contact area; and,
forming an upper conductive electrode on the phase changing memory element.

10. The method of claim 9, wherein the phase changing memory element comprises a chalcogenide.

11. The method of claim 10, wherein the chalcogenide comprises a material selected from the group consisting of Ge, Te, and Sb.

12. The method of claim 9, wherein the upper conductive electrode comprises a material selected from the group consisting of W, TiN, TiW, TiAl, TiAlN, and combinations thereof.

13. The method of claim 1, wherein the spacer is formed adjacent a sidewall of a dielectric insulating portion.

14. The method of claim 13, wherein the dielectric insulating portion is formed partially overlapping the conductive area.

15. The method of claim 13, wherein the dielectric insulating portion is formed spaced apart from the conductive area.

16. The method of claim 13, wherein the dielectric insulating portion comprises silicon oxide selected from the group consisting of PECVD oxide, PETEOS, BPTEOS, BTEOS, PTEOS, TEOS, PEOX, low-K dielectric, and fluorine doped silicate glass (FSG).

17. The method of claim 1, wherein the SOL layer is selected from the group consisting of organic and inorganic materials.

18. The method of claim 17, wherein the SOL layer is selected from the group consisting of spin-on-glass, benzocyclobutene (BCB), and polyimides.

19. The method of claim 1, wherein the step of removing comprises an etchback process selected from the group consisting of a wet etching and a dry etching process.

20. A method for forming a phase change memory structure comprising:
providing a substrate comprising a conductive area;
forming a spacer having a positive radius of curvature at an upper portion of the spacer and the spacer bottom portion partially overlapping the conductive area, the spacer comprising a material selected from the group consisting of a temperature sensitive phase changing material and a conductive material;
forming a spin-on-layer (SOL) over the spacer; and,
removing a portion of the SOL to uncover an upper portion of the spacer to define an electrode contact area for a phase changing memory element.

* * * * *